US009837789B2

(12) United States Patent
Takigawa

(10) Patent No.: US 9,837,789 B2
(45) Date of Patent: Dec. 5, 2017

(54) AIR-COOLED LASER DEVICE HAVING L-SHAPED HEAT-TRANSFER MEMBER WITH RADIATING FINS

(71) Applicant: FANUC CORPORATION, Minamitsuru-gun, Yamanashi (JP)

(72) Inventor: Hiroshi Takigawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/053,141

(22) Filed: Feb. 25, 2016

(65) Prior Publication Data

US 2016/0254642 A1 Sep. 1, 2016

(30) Foreign Application Priority Data

Feb. 26, 2015 (JP) ................. 2015-036752

(51) Int. Cl.
| | |
|---|---|
| H01S 3/04 | (2006.01) |
| H01S 5/024 | (2006.01) |
| H01S 5/02 | (2006.01) |
| H01S 5/022 | (2006.01) |
| H01S 5/40 | (2006.01) |

(52) U.S. Cl.
CPC ...... H01S 5/02407 (2013.01); H01S 5/02469 (2013.01); *H01S 5/02* (2013.01); *H01S 5/02248* (2013.01); *H01S 5/4025* (2013.01)

(58) Field of Classification Search
CPC .. H01S 5/02469; H01S 5/02407; H01S 5/024; H01S 3/041; H01S 3/0014; H01S 3/0407; H01S 3/04; H01S 3/00

USPC ................ 372/34, 35, 36; 361/659; 352/61; 353/58
See application file for complete search history.

(56) References Cited

U.S. PATENT DOCUMENTS

| | | | | |
|---|---|---|---|---|
| 2005/0174732 A1* | 8/2005 | Lin | ........................... | G06F 1/20 361/695 |
| 2005/0231913 A1* | 10/2005 | Malone | .............. | H05K 7/20772 361/698 |

(Continued)

FOREIGN PATENT DOCUMENTS

| | | | | |
|---|---|---|---|---|
| JP | 09-326579 | * | 12/1997 | ............... H05K 7/20 |
| JP | 09-326579 A | | 12/1997 | |

(Continued)

*Primary Examiner* — Tuan Nguyen
(74) *Attorney, Agent, or Firm* — RatnerPrestia

(57) ABSTRACT

An air-cooled laser device having a heat radiating structure capable of effectively radiating heat generated by a laser diode module and also radiating heat generated by a heating component other than the laser diode module, without being increased in size. The laser device has: laser diode modules; a heat-receiving plate horizontally-arranged, to which the laser diode modules are thermally connected; at least one L-shaped heat-transferring member extending inside the heat-receiving plate and bending at a right angle outside heat-receiving plate; a plurality of heat radiating fins attached to a vertical portion of the heat-transferring member so that each fin extends in a horizontal direction; and an axial fan for sending air to an upper space of the heat-receiving plate through between the fins. The air after flowing between the fins cools a heating component other than the laser diode module, positioned in the upper space, without changing the flow direction.

6 Claims, 8 Drawing Sheets

(56) References Cited

U.S. PATENT DOCUMENTS

| | | | |
|---|---|---|---|
| 2008/0296001 A1 | 12/2008 | Chen | |
| 2011/0194578 A1* | 8/2011 | Hirose | H04N 9/3161 372/36 |
| 2011/0197596 A1* | 8/2011 | Cheng | F28D 15/00 62/3.2 |
| 2011/0225983 A1* | 9/2011 | Kojima | H01L 23/38 62/3.7 |
| 2012/0287954 A1* | 11/2012 | Saruwatari | H01S 5/02469 372/34 |
| 2014/0071624 A1* | 3/2014 | Aoki | H05K 7/20263 361/699 |
| 2016/0048179 A1* | 2/2016 | Watanabe | H05K 7/20727 361/679.52 |

FOREIGN PATENT DOCUMENTS

| | | | | |
|---|---|---|---|---|
| JP | 200157492 A | | 2/2001 | |
| JP | 2002329928 A | | 11/2002 | |
| JP | 2008-021899 | * | 1/2008 | H01S 3/042 |
| JP | 2008-021899 A | | 1/2008 | |
| JP | 2009-239166 | | 10/2009 | |
| JP | 201196789 A | | 5/2011 | |
| JP | 2012-59952 | * | 3/2012 | H05K 7/20 |
| JP | 2012-059952 A | | 3/2012 | |

\* cited by examiner

AIR-COOLED LASER DEVICE HAVING L-SHAPED HEAT-TRANSFER MEMBER WITH RADIATING FINS

BACKGROUND OF THE INVENTION

1. Field of the Invention

The present invention relates to an air-cooled type laser device having a laser diode as a light emitting source or an excitation light source, and having a structure to radiate heat generated from the laser diode.

2. Description of the Related Art

Generally, in a laser device, having a laser diodes (or semiconductor lasers) as a light emitting source or an excitation light source, there are two types, i.e., an air-cooled type in which heat generated by a laser diode module including a laser diode is radiated by air; and a water-cooled type which is connected to a circulation type cooling water supply device (or a chiller).

The air-cooled type laser device is more advantageous than the water-cooled type, in that the air-cooled type is easily moved, an occupied area thereof is small, restrictions of an installation location thereof are few, and an installation cost thereof is low, etc. However, in the air-cooled type, it is difficult to decrease the temperature of the laser diode module to the same degree of the water-cooled type. In particular, since a high-power laser device must have many laser diode modules having a large amount of heat generation, it is necessary to provide an effective heat radiating structure to the laser device in order to prevent the laser device from having to be increased in size.

As a relevant prior art document, JP 2008-021899 A discloses a laser oscillator having a semiconductor laser heat radiating member to radiate heat generated by a semiconductor laser array, a fiber laser heat radiating member to radiate heat generated by an optical fiber for a fiber laser, a cooling fan for sending cooling air, and a guide member for guiding the cooling air from the cooling fan.

JP 2012-059952 A discloses a structure for cooling an electronic device, including a heat radiator having an L-shaped heat pipe, a plurality of heat radiating fins attached to a substantially horizontal part of the heat pipe, and a heat receiving plate to which substantially vertical portions of the heat radiating fins are attached; a plurality of electronic devices attached to the heat receiving plate; and a container for containing the plurality of electronic devices.

JP 2009-239166 A discloses a flat heat sink including: a plurality of thin plates layered having an air guiding portion and a hollow portion for containing a centrifugal fan, the thin plated being layered with a certain gap therebetween; at least one heat radiating fin part connected to ends of the thin plates, in which air guided by the air guiding portion of the thin plates flows through the heat radiating fin part; and at least one heat pipe, having one end which is thermally connected to the portion of the thin plate thermally connected to a heating component and the other end which is thermally connected to the heat radiating fin part, in which at least a part of the heat pipe is positioned so as to form a space between the thin plates and the heat pipe.

Further, JP H09-326579 A discloses a cooling unit having a heat receiving part positioned on a heating element, a heat sink having a cooling fan, a plurality of heat transferring parts for transferring heat of the heat receiving part to the heat sink, and a connecting part positioned between the heat transferring parts so that the heat transferring part is detachable.

In many cases, an air-cooled laser device has a fin set including a plurality of fins positioned having a certain gap. In this regard, in order to improve cooling efficiency of the fin set, it is more effective to increase an area of an inlet portion (or an inlet area) for the cooling air defined by the fin set, than to increase a length of the heat radiating fin (or a fin length) along an air-flow direction. Further, it is preferable that a large amount of cooling air flow between the fins as possible, whereas the amount of cooling air is decreased when the fin length is long, since a pressure loss of the cooling air is increased.

In order to improve the cooling efficiency, it is preferable to use a heat radiating structure through which air can smoothly flow, in which the number of portions, where the flow direction of the air is changed (i.e., the pressure loss is increased), is reduced as possible. However, in many cases, the air-cooled laser device includes components such as a power-supply unit, etc., other than the laser diode module, and such components may also generate heat. Therefore, it is desired that the air smoothly flow without being blocked by the components, while cooling the components.

The above related art documents do not provide a sufficient solution for solving the above problems. For example, in a heat radiating structure as shown in FIG. 5 of JP 2008-021899 A, the flow of cooling air is changed by a substantially right angle so as to flow in the upward and downward directions, after the cooling air collides with a heat radiating fin for a semiconductor laser (or a laser diode module), and then, the flow of the cooling air flowing in the downward direction is changed again by a substantially right angle so that the cooling air flows to a heat radiating fin for a fiber laser. Therefore, the pressure loss of the cooling air may be relatively high. Further, since it could be understood that heat of heating components other than the semiconductor laser and the fiber laser is radiated by natural convection, a temperature rise of the heating components may affect reliability of the laser device.

As explained above, in a high-power air-cooled laser device having a laser diode as a light emitting source or an excitation light source, it is necessary to arrange components other than the plurality of laser diode modules, such as a power-supply unit and a control unit, in a housing of the laser device. The conventional laser unit does not have sufficient heat radiating performance, since a surface area for radiating heat from the heating components is limited and/or the cooling air cannot smoothly flow and the flow rate thereof is decreased, due to the existence of the heating components.

SUMMARY OF THE INVENTION

The object of the present invention is to provide an air-cooled laser device having a heat radiating structure capable of effectively radiating heat generated by a laser diode module and also radiating heat generated by a heating component other than the laser diode module, without being increased in size.

The present invention provides an air-cooled laser device having a laser diode module as a light emitting source or an excitation light source, the air-cooled laser device comprises: a heat-receiving plate substantially horizontally-arranged, on which the laser diode module is mounted so as to be thermally connected to the heat-receiving plate; at least one L-shaped heat-transferring member attached to an inside or a surface of the heat-receiving plate, the L-shaped heat-transferring member extending in a surface direction of the heat-receiving plate and bending at a substantially right angle outside the heat-receiving plate so as to extend in a substantially upward vertical direction; a plurality of heat radiating fins attached to a substantially vertical portion of the L-shaped heat-transferring member so that each of the plurality of heat radiating fins extends in a substantially horizontal direction; and an axial fan for sending air to an upper space of the heat-receiving plate through between the plurality of heat radiating fins, wherein air after flowing through between the plurality of heat radiating fins cools a heating component other than the laser diode module, the heating component being positioned in the upper space of the heat-receiving plate.

In a preferred embodiment, the heat-transferring member is a heat pipe.

In a preferred embodiment, the laser diode module is mounted on a first heat-receiving surface of the heat-receiving plate, and a heating component is mounted on a second heat-receiving surface of the heat-receiving plate opposed to the first heat-receiving surface.

In a preferred embodiment, the heat-receiving plate is not positioned in a lower projected space of the heat radiating fins.

In a preferred embodiment, the air-cooled laser device comprises a case having a substantially sealing structure which contains the heat-receiving plate and the laser diode module mounted on the heat-receiving plate.

In a preferred embodiment, an outer shape of a housing of the air-cooled laser device is a substantially rectangular parallelepiped; an inlet port formed on a first lateral side surface of the housing is aligned with an inflow region of air flowing between the heat radiating fins and has a substantially same shape as the inflow region; at least one axial fan is positioned at an outlet port formed on a second lateral side surface of the housing opposed to the first lateral side surface; and, when an inside space of the housing including the plurality of heat radiating fins is viewed on a cross section parallel to the first lateral side surface, the heat radiating fins are positioned over a substantially entire area of the cross section, except for a lower partial area where the heat-receiving plate and a heating component including the laser diode module mounted on the heat-receiving plate are positioned.

BRIEF DESCRIPTION OF THE DRAWINGS

The above and other objects, features and advantages of the present invention will be made more apparent by the following description of the preferred embodiments thereof, with reference to the accompanying drawings, wherein.

DETAILED DESCRIPTION

Figure 1:
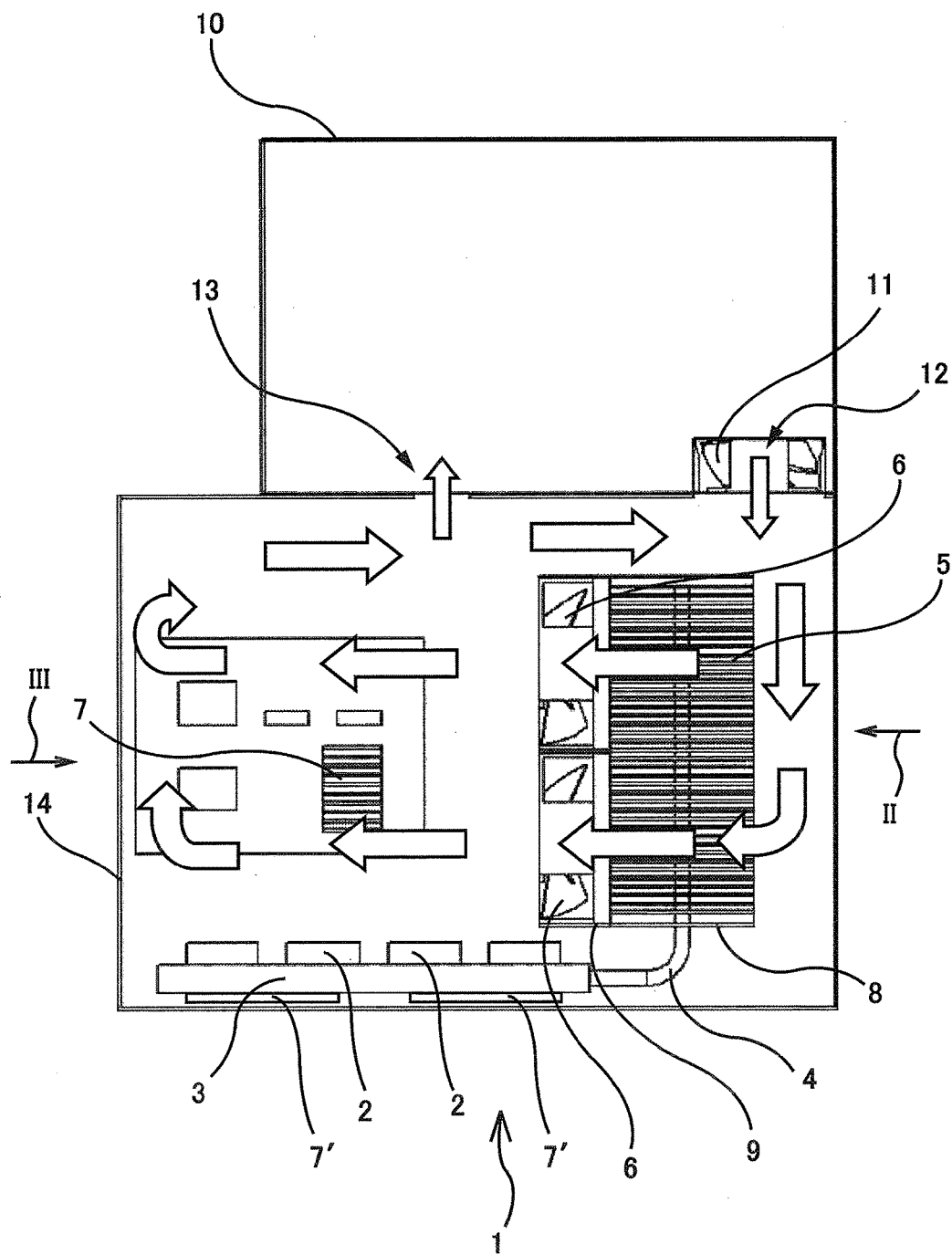
FIG. 1 is a cross-sectional view showing a schematic configuration of an air-cooled laser device according to a first embodiment of the present invention.
Figure 2:
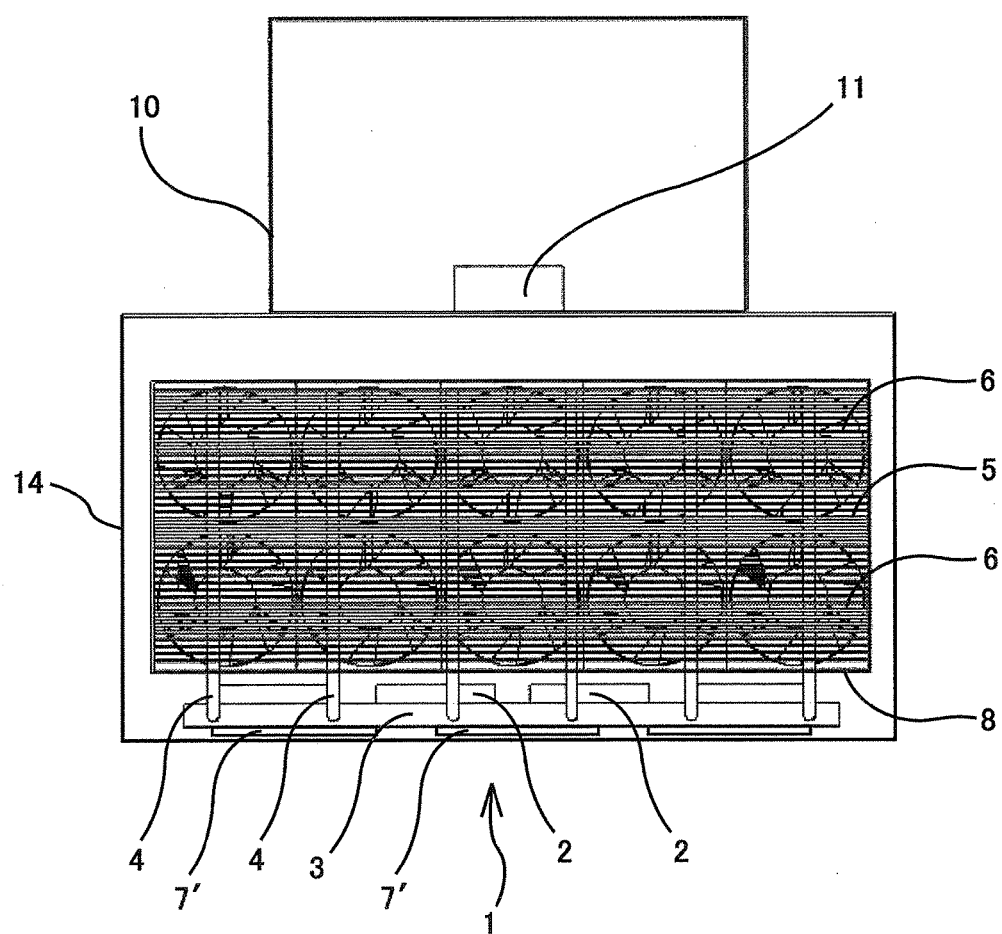
FIG. 2 is a schematic view showing an inside space of the air-cooled laser device of FIG. 1, viewed from a side where heat radiating fins are positioned.
Figure 3:
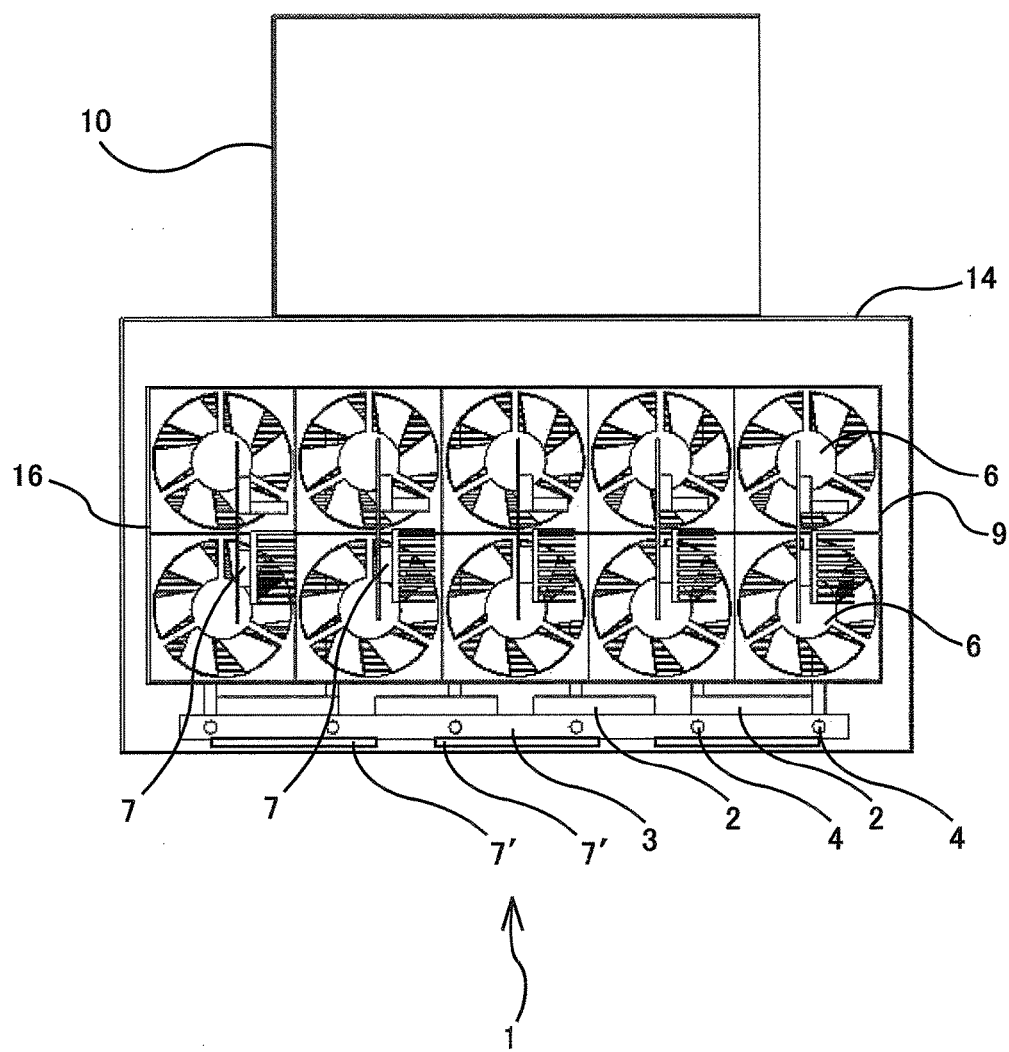
FIG. 3 is a schematic view showing the inside space of the air-cooled laser device of FIG. 1, viewed in a direction opposed to the direction of FIG. 2.

FIGS. 1 to 3 show a schematic configuration of an air-cooled laser device 1 according to a first embodiment of the present invention, and FIG. 1 is a cross-sectional view of air-cooled laser device 1. Air-cooled laser device 1 has: at least one (normally, a plurality of) laser diode module 2 including at least one laser diode chip or laser diode array; a heat-receiving plate 3 substantially horizontally-arranged, on which laser diode modules 2 are mounted so as to be thermally connected to heat-receiving plate 3; at least one L-shaped heat-transferring member 4 attached to an inside or a surface of heat-receiving plate 3, L-shaped heat-transferring member 4 extending in a surface direction (or a direction substantially perpendicular to a thickness direction) of heat-receiving plate 3 and bending at a substantially right angle outside heat-receiving plate 3 so as to extend in a substantially upward vertical direction; a plurality of heat radiating fins 5 attached to a substantially vertical portion of L-shaped heat-transferring member 4 so that each of heat radiating fins 5 extends in a substantially horizontal direction; and an axial fan 6 for sending air to an upper space of heat-receiving plate 3 through between fins 5, and these components are incorporated in a housing 14. Laser device 1 of the embodiment has a heat radiating structure in which air after flowing through between fins 5 cools a heating component 7 other than laser diode module 2, positioned in the upper space of heat-receiving plate 3, without substantially changing the flow direction of the air (i.e., the air flows substantially straightly).

From laser diode module 2 positioned on the upper surface of heat-receiving plate 3, heat is generated along with a laser beam output, and the generated heat is transferred to heat-receiving plate 3. Then, the heat is transferred to heat radiating fins 5 via heat-transferring member 4, and is radiated from fins 5 to air flowing between fins 5 by axial fan 6. By virtue of this, an increase in temperature of heat-receiving plate 3 (or laser diode module 2) is limited.

Although it is preferable that heat-transferring member 4 be manufactured from a material such as copper having high thermal conductivity, the material is not limited to a particular material. It is preferable that a heat pipe be used as heat-transferring member 4, since the thermal conductivity of the heat pipe is substantially about a thousand times higher than the thermal conductivity of silver. By using the heat pipe having the thermal conductivity about a thousand times higher than silver, the difference in temperature between the laser diode module and the heat radiating fins can be significantly reduced. In particular, since a heat radiating part (or a low-temperature part) where operating fluid within the heat pipe is condensed extends in the substantially vertical direction, the condensed operating fluid is smoothly returned or refluxed to a high-temperature part positioned below, whereby a thermal resistance of the heat pipe can be reduced and the maximum amount of heat transport thereof can be increased.

In addition, reference numeral 8 represents a duct for the heat radiating fins, and reference numeral 9 represents an axial fan.

In FIG. 1, white or outlined arrows indicate the flow direction of the air at several positions in housing 14. As shown in FIG. 1, in the first embodiment, since a cross-sectional area of the flow path is large and the flow velocity of the air therein is low, except for between fins 5 and the vicinity of fins 5, the pressure loss of the cooling air is small. Further, since the air flows substantially straightly between fins 5, the pressure loss of the air flowing between the fins is also small. Therefore, in this embodiment, since the flow rate and flow velocity of the air flowing between fins 5 can be increased, a radiation amount from heat radiating fins 5 can be increased, whereby an increase in temperature of heat-receiving plate 3 (or laser diode module 2) can be effectively avoided. In this regard, it is preferable that the thickness of each fin and/or a gap between neighboring fins be optimized corresponding to pressure-flow characteristics of axial fan 6 to be used. Further, after flowing through between fins 5, the air having a relatively high flow velocity straightly flows toward heating component 7 other than laser diode module 2, positioned in the space above heat-receiving plate 3, without being blocked by heat-receiving plate 3, etc., and/or without changing the flow direction. Therefore, an increase in temperature of heating component 7 positioned above heat-receiving plate 3 can also be effectively avoided.

Further, in the first embodiment, in order to use the air-cooled laser device even in a hot environment, housing 14 of the laser device is configured as a substantially sealing structure, and a panel cooler 10 is positioned adjacent to housing 14. Panel cooler 10 has a fan 11 for discharging cold air from a cold air discharge port 12, and the cold air discharged from discharge port 12 of panel cooler 10 absorbs heat in housing 14. Then, the heated air is refluxed to panel cooler 10 via a suction port 13 of panel cooler 10. The flow rate of the cold air discharged from discharge port 12 is generally the same as the flow rate of the cold air refluxed to panel cooler 10 via suction port 13. In this regard, in order to obtain sufficient cooling characteristics of heat radiating fins 5, it is preferable that the total flow rate the air flowing between fins 5 be considerably larger than the flow rate of the cold air through discharge port 12 or suction port 13. Therefore, in the configuration of the first embodiment, the cold air from panel cooler 10 is added to the air circulating in housing 14 of air-cooled laser device 1 immediately before flowing between heat radiating fins 5 (in FIG. 1, at a right-upper area in housing 14), so that the air flows between fins 5 after being cooled by the cold air.

FIG. 2 is a view of air-cooled laser device 1 according to the first embodiment, viewed from a side where heat radiating fins 5 are positioned (i.e., in a direction of an arrow II in FIG. 1), in which a lateral side of housing 14 is omitted or removed. In the first embodiment, in order to obtain high cooling characteristics, an inlet area of the air flowing between fins 5 (or an opening area of duct 8 for the heat radiating fins) is designed as wide as possible. Further, in order to increase the flow rate of the air flowing between fins 5, ten axial fans 6 are positioned (concretely, five fans are positioned on an upper level, and five fans are positioned on a lower level). In addition, as shown in FIG. 2, in order to reduce a thermal resistance between heat radiating fins 5 and heat-receiving plate 3 and improve total fin efficiency by minimizing the temperature difference between each fin, six heat-transferring members (or heat-pipes), aligned in the substantially horizontal direction, are used.

FIG. 3 is a view of air-cooled laser device 1, viewed in a direction opposed to the direction of FIG. 2 (i.e., in a direction of an arrow III in FIG. 1), in which a lateral side of housing 14 is omitted or removed. Heating component 7 other than laser diode module 2 is positioned at a downstream side of axial fan 6 positioned above heat-receiving plate 3. As shown in FIG. 3, when components including heating component 7 positioned at the downstream side of axial fan 6 are arranged so that a projected area thereof with respect to the air flow direction is minimized, a flow resistance of the air is reduced. Therefore, an increase in temperature of heating component 7 can be effectively limited. In FIG. 3, although heating component 7 positioned above heat-receiving plate 3 is illustrated as a component having a separate heat sink mounted on a printed board, heating component 7 may be a component positioned within a unit such as a power unit, etc.

As shown in FIGS. 1 to 3, another heating component 7' may be positioned on a second (lower) heat-receiving surface opposed to a first (upper) heat-receiving surface of heat-receiving plate 3. By virtue of this, heat generated by heating component 7' can also be effectively removed from heat radiating fins 5, as well as the heat of laser diode module 2. Depending on the shape of the component mounted on heat-receiving plate 3, the component does not substantially block the air flow, whereby the pressure loss of the cooling air in a space other than between fins 5 can be reduced.

In the first embodiment, laser diode modules 2 are mounted on the upper surface of heat-receiving plate 3, and other components 7' are mounted on the lower surface of heat-receiving plate 3. To the contrary, laser diode modules 2 may be mounted on the lower surface of heat-receiving plate 3, and other components 7' may be mounted on the upper surface of heat-receiving plate 3. Otherwise, laser diode modules 2 may be positioned on the both sides of heat-receiving plate 3. In addition, when laser device 1 is a fiber laser device having a laser diode as an excitation light source, the fiber laser, etc., may be mounted on heat-receiving plate 3.

As shown in FIG. 1, it is preferable that heat-receiving plate 3 be positioned in a lower space in housing 14 (more preferably, positioned in the vicinity of a lower inner surface of housing 14), so that heat-receiving plate 3 is not positioned within a lower projected space of heat radiating fins 5 (i.e., heat-receiving plate 3 does not pass into a shadow of fins 5 when being viewed from above). By virtue of this, even when heat-receiving plate 3, heat-transferring member 4 and heat radiating fins 5 (except for axial fan 6 which is easily detached) are thermally connected to each other and are assembled as a substantially integrated cooling structure, an operator can easily access the components mounted on the upper surface of heat-receiving plate 3, whereby the operator can easily attach the component to the plate and/or carry out maintenance of the component, etc.

As shown in FIG. 1, in order to reduce the amount of useless air which flows from axial fan 6 without flowing between fins 5, it is preferable that heat radiating fins 5 and axial fan 6 be positioned in ducts 8 and 9, respectively, and ducts 8 and 9 be hermetically connected to each other. Alternatively, heat radiating fins 5 and axial fan 6 may be positioned in substantially one duct. However, when duct 8 for the fins and duct 9 for the axial fan are detachably connected to each other as shown in FIG. 1, the component can be easily mounted on the upper surface of heat-receiving plate 3 and/or maintenance of the component can be easily carried out, by removing only duct 9 for the axial fan.

In the example of FIGS. 1 to 3, the air between heat radiating fins 5 is sucked by axial fan 6 positioned at the downstream side of fins 5. Alternatively, the axial fan may be positioned at the upstream side of the heat radiating fins, so that the axial fan pressurizes air between the fins.

In the cross-section as shown in FIG. 1, etc., an inner structure of panel cooler 10, other than fan 11 for discharging cold air, is abbreviated in the drawing. In fact, a support member for fixing heat-receiving plate 3 and/or heating component 7 to housing 14 of the laser device is used, while the support member is also abbreviated in the drawing for clarity.

Figure 4:
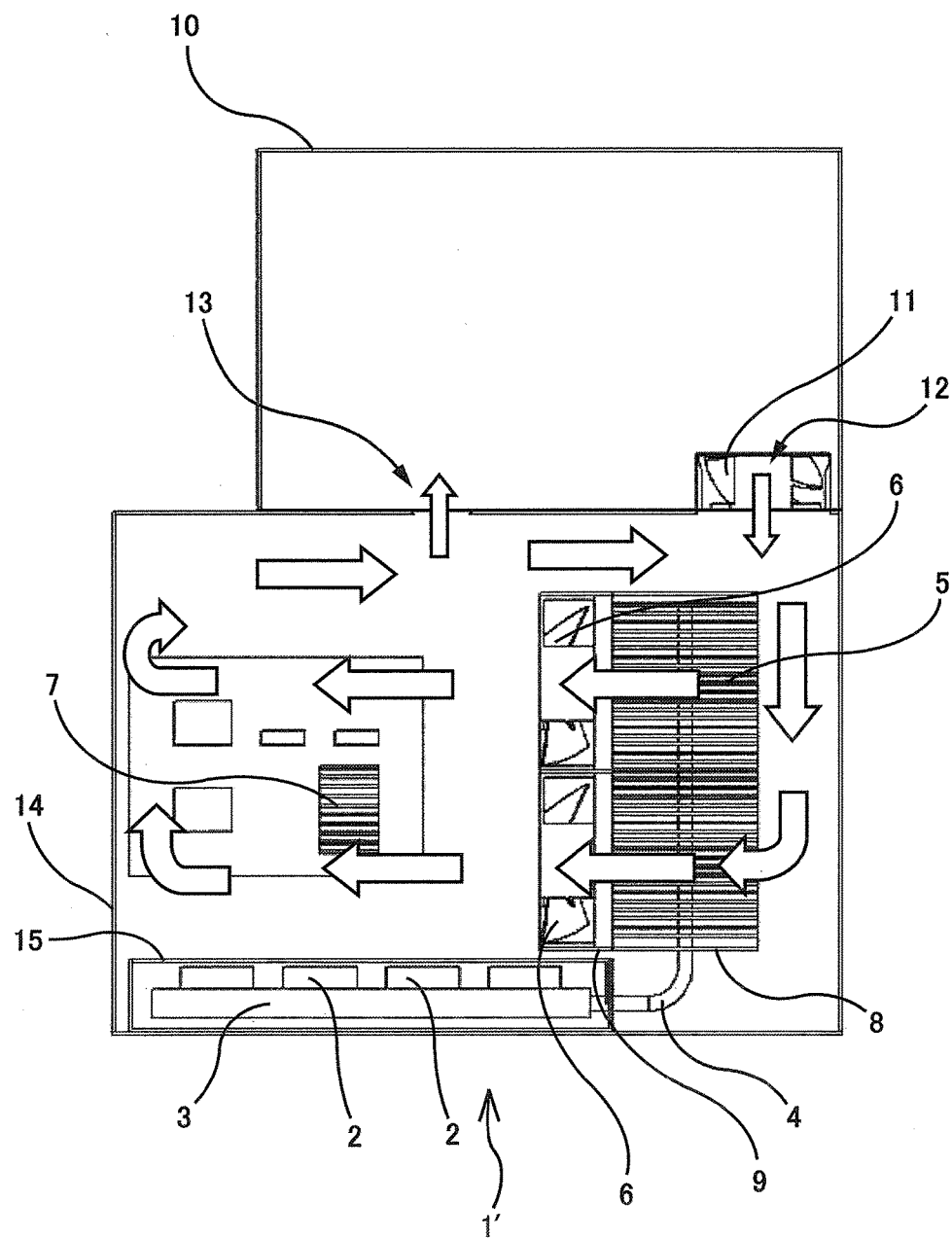
FIG. 4 is a cross-sectional view showing a schematic configuration of an air-cooled laser device according to a second embodiment of the present invention.

FIG. 4 is a cross-sectional view showing a schematic configuration of an air-cooled laser device 1' according to a second embodiment of the present invention. In the second embodiment, the same reference numerals are added to components substantially equivalent to the components of the first embodiment, and detailed explanations thereof will be omitted.

In the second embodiment, heat-receiving plate 3 and laser diode module 2 mounted on heat-receiving plate 3, etc., are contained in a case 15 having a substantially sealing structure. Heat-transferring member 4 is extends through a hole formed on case 15 and is connected to heat radiating fins 5 positioned outside case 15. A fan unit constituted by axial fan 6 and duct 9 for the axial fan is detachable from heat radiating fins 5 and duct 8 for the fins.

Therefore, in the second embodiment, when axial fan 6 and duct 9 for the axial fan are removed, an upper part of case 15 can be opened or closed even after the cooling structure is assembled. As a result, the operator can easily access or mount the component on the upper surface of heat-receiving plate 3 and can easily carry out the maintenance of the component. Further, by containing heat-receiving plate 3 in case 15, heat-receiving plate 3 and the components including laser diode module 2 mounted on heat-receiving plate 3 can be prevented from being heated by the heated air after flowing between heat radiating fins 5. In addition, when housing 14 does not have the enclosed structure (i.e., when external air may enter housing 14), the component can be protected from outside dusts, etc., by containing the component in case 15.

Figure 5:
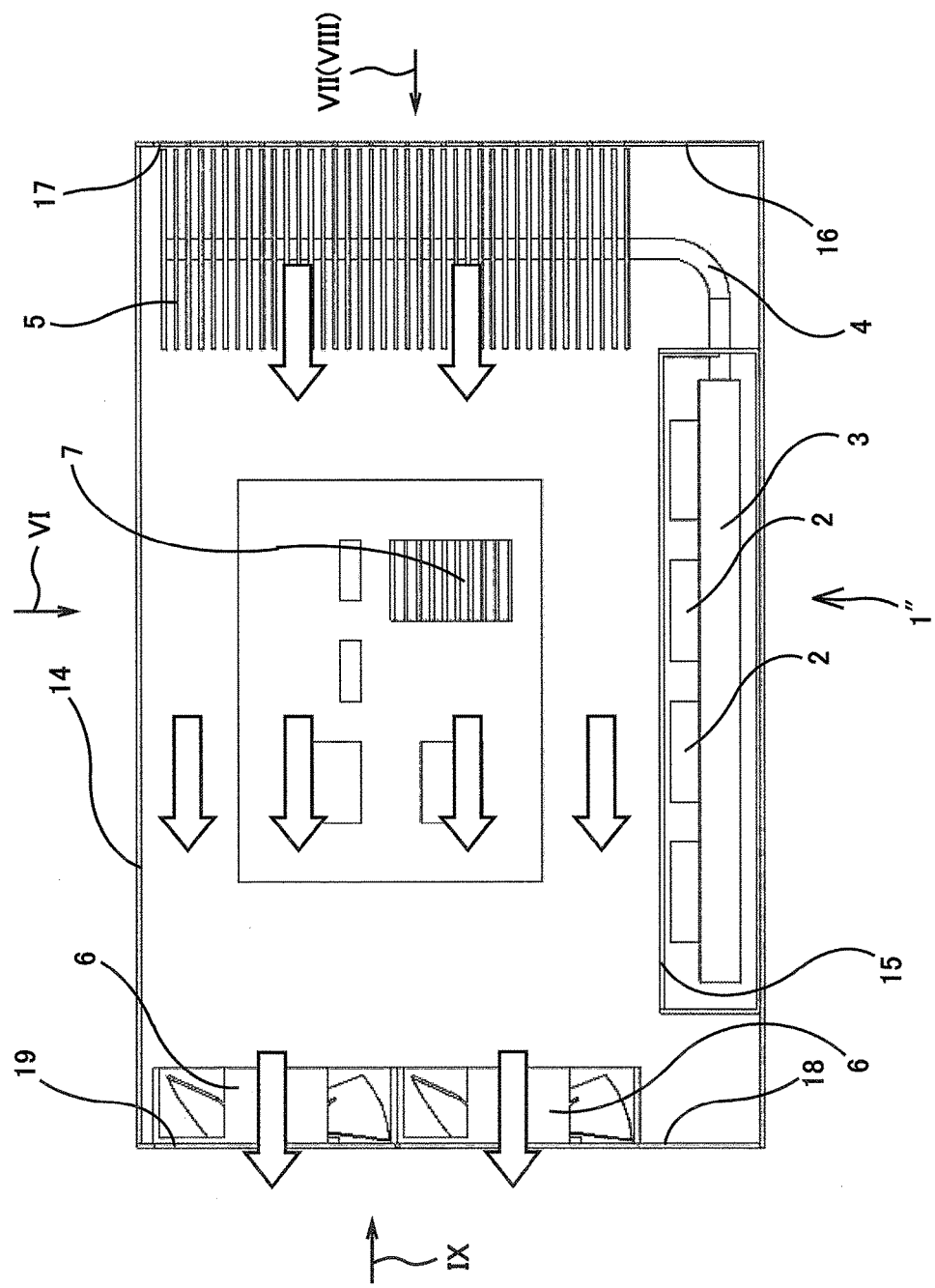
FIG. 5 is a cross-sectional view showing a schematic configuration of an air-cooled laser device according to a third embodiment of the present invention.

FIG. 5 is a cross-sectional view showing a schematic configuration of an air-cooled laser device 1" according to a third embodiment of the present invention. In the third embodiment, the same reference numerals are added to components substantially equivalent to the components of the first or second embodiment, and detailed explanations thereof will be omitted.

Figure 6:
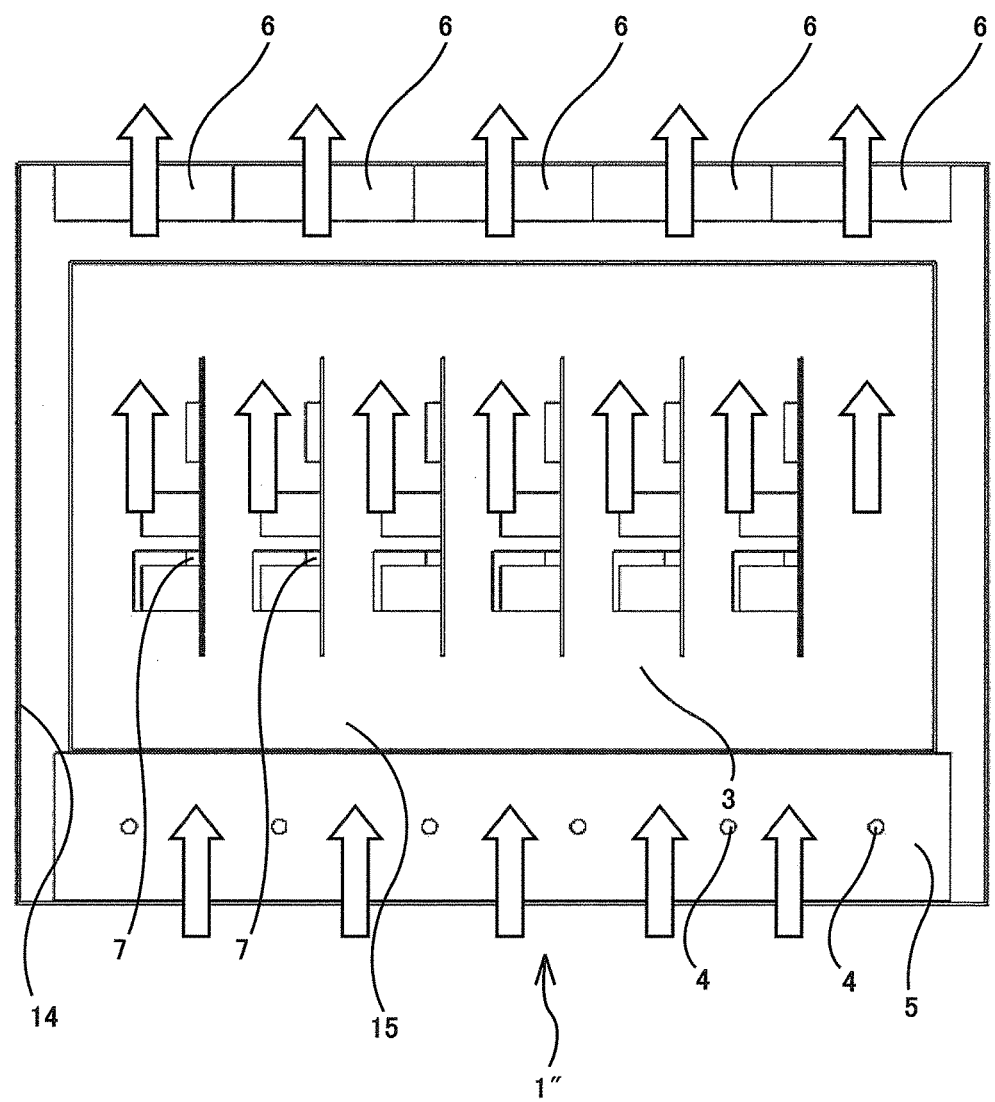
FIG. 6 is a schematic top view of the air-cooled laser device of FIG. 5, in which an upper plate of a housing of the laser device is removed.

FIG. 6 is a view of air-cooled laser device 1" from the above (i.e., viewed in a direction of an arrow VI in FIG. 5), in which an upper plate of housing 14 is abbreviated in the drawing. In FIGS. 5 and 6, white or outlined arrows indicate the flow direction of the (cooling) air, similarly to FIG. 1 or 4. In the third embodiment, the air, after flowing between heat radiating fins 5 which are positioned at the uppermost stream side, flows generally straightly, passes near heating component 7 other than laser diode module 2 positioned above heat-receiving plate 3, and then flows away from housing 14 via axial fan 6. Since the air generally straightly flows over the entire of housing 14, the pressure loss at a space other than between fins 5 is also small, whereby the flow rate of the air can be increased. Further, since heat radiating fins 5 are positioned at the uppermost stream side, the temperature of fins 5 is effectively decreased, whereby the temperatures of heat-receiving plate 3 and laser diode module 2, thermally connected to fins 5 via heat-transferring member 4, are also effectively decreased. Therefore, a life of laser diode module 2 is extended and the reliability thereof is improved. In the third embodiment, similarly to the first or second embodiment, the air after flowing between fins 5 substantially straightly flows toward heating component 7 other than laser diode module 2, positioned in the space above heat-receiving plate 3, and thus heating component 7 is cooled and an increase in temperature thereof is limited. Therefore, the reliability of heating component 7 other than laser diode module 2 can also be improved.

Figure 7:
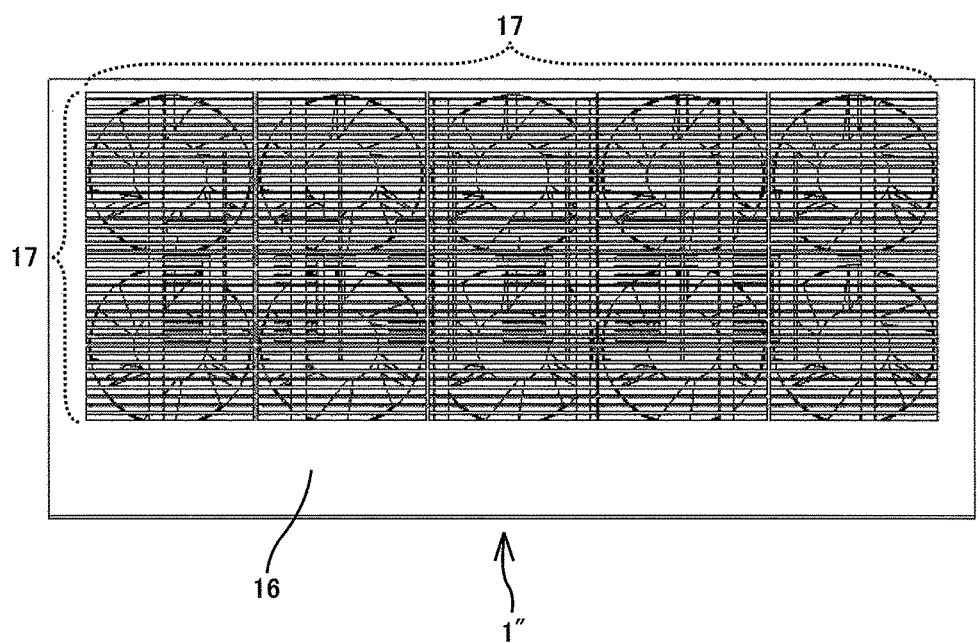
FIG. 7 is a schematic view of the air-cooled laser device of FIG. 5, viewed from an inlet port of the laser device.
Figure 8:
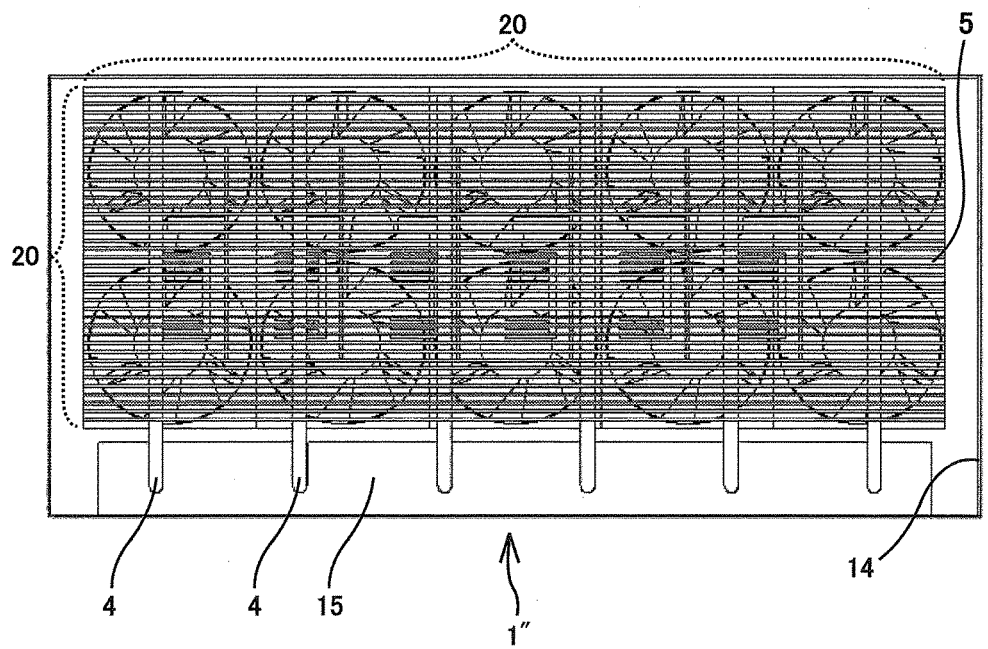
FIG. 8 is a schematic view of the air-cooled laser device of FIG. 5, viewed from the inlet port of the laser device, in which a lateral side plate having the inlet port is removed.

FIG. 7 is a view of air-cooled laser device 1" from the side of an inlet port 17 formed on a first lateral side plate 16 of housing 14 (i.e., viewed in a direction of an arrow VII in FIG. 5), and FIG. 8 shows the state in which first lateral side plate 16 is removed in FIG. 7. Further, FIG. 9 is a view of air-cooled laser device 1" viewed from the side of an outlet port 19 formed on a second lateral side plate 18 of housing 14 (i.e., viewed in a direction of an arrow IX in FIG. 5).

The third embodiment is an open-type air-cooled laser device, in which external air is sucked as cooling air into the laser device, and the air heated by heat radiating fins 5, etc., is discharged from the laser device. Therefore, it is preferable that the open-type air-cooled laser device be used in a condition that the ambient temperature is not considerably high. In the example of FIGS. 5 to 9, the outer shape of housing 14 is a substantially rectangular parallelepiped, and inlet port 17 formed on first lateral side surface 16 of housing 14 is aligned with an inflow region of the air flowing between heat radiating fins 5. As shown in FIG. 7, a bracket indicated by a dashed line represents inlet port 17, and inlet port 17 may be formed by slit punching process. Further, as shown in FIG. 8, a bracket indicated by a dashed line represents inflow region 20 of the air flowing between heat radiating fins 5, and inflow region 20 has a generally same shape as inlet port 17 as shown in FIG. 7.

Figure 9:
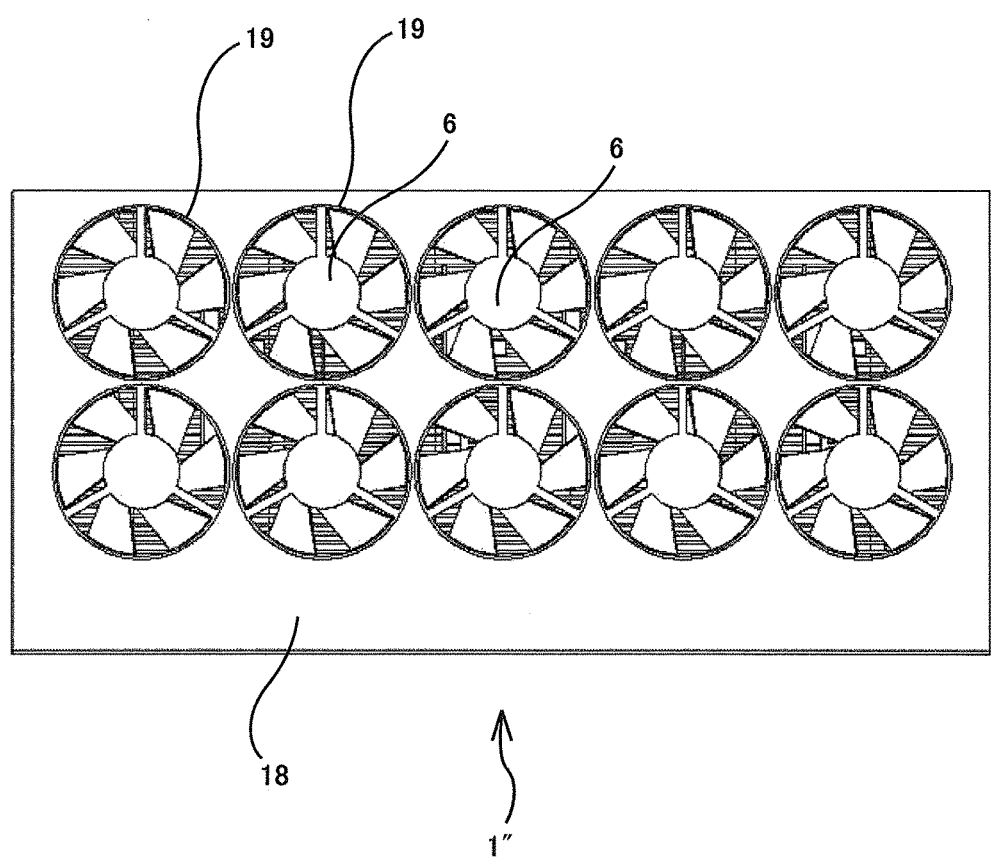
FIG. 9 is a schematic view of the air-cooled laser device of FIG. 5, viewed from an outlet port of the laser device.

As shown in FIG. 5 or 9, at least one axial fan 6 is positioned on second lateral side surface 18 opposed to first lateral side surface 16 of housing 14. In the illustrated embodiment, ten axial fans 6 are respectively arranged at ten outlet ports 19 formed on second lateral side surface 18. A protection cover having a mesh structure may be positioned at each outlet port 19, so that the operator, etc., cannot access axial fan 6 from outside housing 14. In addition, axial fan 6 may be positioned between inlet port 17 and heat radiating fins 5, not on the side of outlet port 19, so that the axial fan pressurizes the air between fins 5.

As shown in FIG. 8, in the third embodiment, it is preferable that, when the inside space of housing 14 including heat radiating fins 5 is viewed on a cross section parallel to first lateral side surface 16, heat radiating fins 5 are generally positioned over an entire area of the cross section, except for a lower partial area where heat-receiving plate 3 and the heating component including laser diode module 2 mounted on heat-receiving plate 3 (or case 15 containing heat-receiving plate 3 and the heating component) are positioned. By virtue of this, an opening area of inflow region 20 can be significantly enlarged, whereby an increase in temperature of laser diode module 2, etc., can be effectively limited.

According to the present invention, the air after flowing between the heat radiating fins can approach the heating component other than the laser diode module, without being blocked by the heat-receiving plat, etc., and/or without changing the flow direction. Therefore, both the laser diode module and the other heating component can be effectively cooled, whereby long lives and high reliabilities thereof can be obtained.

While the invention has been described with reference to specific embodiments chosen for the purpose of illustration, it should be apparent that numerous modifications could be made thereto, by a person skilled in the art, without departing from the basic concept and scope of the invention.

The invention claimed is:

1. An air-cooled laser device having a laser diode module as a light emitting source or an excitation light source, the air-cooled laser device comprises:
   a heat-receiving plate substantially horizontally-arranged, on which the laser diode module is mounted so as to be thermally connected to the heat-receiving plate;
   at least one L-shaped heat-transferring member attached to an inside or a surface of the heat-receiving plate, the L-shaped heat-transferring member extending in a surface direction of the heat-receiving plate and bending at a substantially right angle outside the heat-receiving plate so as to extend in a substantially upward vertical direction;
   a plurality of heat radiating fins attached to a substantially vertical portion of the L-shaped heat-transferring member so that each of the plurality of heat radiating fins extends in a substantially horizontal direction; and
   an axial fan for sending air to an upper space of the heat-receiving plate through between the plurality of heat radiating fins,
   wherein air after flowing through the plurality of heat radiating fins cools a separate heating component that is positioned separate from the laser diode module and separate from the heat-receiving plate such that the separate heating component does not contact the laser diode module and does not contact the heat-receiving plate, the separate heating component being positioned in front of the axial fan such that the air flowing through the heat radiating fins flows straight from the axial fan toward the heating component.

2. The air-cooled laser device as set forth in claim 1, wherein the heat-transferring member is a heat pipe.

3. The air-cooled laser device as set forth in claim 1, wherein the laser diode module is mounted on a first heat-receiving surface of the heat-receiving plate, and a heating component is mounted on a second heat-receiving surface of the heat-receiving plate opposed to the first heat-receiving surface.

4. The air-cooled laser device as set forth in claim 1, wherein the heat-receiving plate is not positioned in a lower projected space of the heat radiating fins.

5. The air-cooled laser device as set forth in claim 1, wherein the air-cooled laser device comprises a case having a substantially sealing structure which contains the heat-receiving plate and the laser diode module mounted on the heat-receiving plate.

6. The air-cooled laser device as set forth in claim 1, wherein an outer shape of a housing of the air-cooled laser device is a substantially rectangular parallelepiped; an inlet port formed on a first lateral side surface of the housing is aligned with an inflow region of air flowing between the heat radiating fins and has a generally same shape as the inflow region; at least one axial fan is positioned at an outlet port formed on a second lateral side surface of the housing opposed to the first lateral side surface; and, when an inside space of the housing including the plurality of heat radiating fins is viewed on a cross section parallel to the first lateral side surface, the heat radiating fins are positioned over a generally entire area of the cross section, except for a lower partial area where the heat-receiving plate and a heating component including the laser diode module mounted on the heat-receiving plate are positioned.

* * * * *